United States Patent
Boujamaa et al.

(10) Patent No.: US 10,937,494 B2
(45) Date of Patent: Mar. 2, 2021

(54) INCREASING CURRENT TO MEMORY DEVICES WHILE CONTROLLING LEAKAGE CURRENT

(71) Applicant: Arm Limited, Cambridge (GB)

(72) Inventors: El Mehdi Boujamaa, Valbonne (FR); Akshay Kumar, Noida (IN)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/277,988

(22) Filed: Feb. 15, 2019

(65) Prior Publication Data

US 2020/0265891 A1 Aug. 20, 2020

(51) Int. Cl.
*G11C 13/00* (2006.01)
*H01L 27/22* (2006.01)

(52) U.S. Cl.
CPC ...... *G11C 13/0069* (2013.01); *G11C 13/0038* (2013.01); *H01L 27/224* (2013.01); *G11C 2213/15* (2013.01); *G11C 2213/79* (2013.01)

(58) Field of Classification Search
CPC ................................................. G11C 13/0069
USPC ......................................................... 365/148
See application file for complete search history.

(56) References Cited

U.S. PATENT DOCUMENTS

| | | | | |
|---|---|---|---|---|
| 7,423,898 B2* | 9/2008 | Tanizaki | ................ | G11C 11/56 365/148 |
| 8,867,267 B2* | 10/2014 | Mouli | ................ | G11C 11/5685 365/175 |
| 9,361,994 B1* | 6/2016 | Kouznetsov | ........ | G11C 11/4074 |
| 9,390,793 B1* | 7/2016 | Nigam | ................ | G11C 13/004 |
| 9,460,786 B2* | 10/2016 | Kang | ....................... | G11C 7/14 |
| 9,792,994 B1* | 10/2017 | Modi | ............... | H03K 19/00315 |
| 10,453,532 B1* | 10/2019 | Antonyan | ............... | G11C 11/15 |
| 2010/0182180 A1* | 7/2010 | Ikoma | ................. | H03M 1/0604 341/144 |
| 2014/0307513 A1* | 10/2014 | Chun | ..................... | G11C 5/147 365/189.09 |
| 2018/0025778 A1* | 1/2018 | Mori | ..................... | G11C 5/147 365/148 |

\* cited by examiner

*Primary Examiner* — Muna A Techane
(74) *Attorney, Agent, or Firm* — Pramudji Law Group PLLC; Ari Pramudji

(57) ABSTRACT

Briefly, the disclosure relates to circuits utilized to perform writing operations to a memory array, in which elements of the array comprise resistive memory cells coupled in series with an access device. In one embodiment, a circuit may comprise a supply voltage coupled to a first side of the array and a current source coupled to a second side of the array. The access devices of the elements of the array may be body-biased, which may operate to reduce the turn-on voltage ($V_{TH}$) of the access devices. Particular voltages may be applied to gate regions of the access devices to control leakage current to the resistive memory cells of the array.

16 Claims, 4 Drawing Sheets

INCREASING CURRENT TO MEMORY DEVICES WHILE CONTROLLING LEAKAGE CURRENT

TECHNICAL FIELD

This disclosure relates to circuits and methods for generating current to perform operations involving memory devices while controlling leakage current.

BACKGROUND

In computing devices, which may include devices such as general-purpose hand-held computers, gaming devices, communications devices, smart phones, embedded or special-purpose computing systems, an array of memory cells may be utilized to store instructions, for example, for use by one or more processors of the computing device. Such computing devices may utilize various memory technologies, such as arrays of random-access memory (RAM) cells, to store instructions executable by a processor and/or to store any results of such execution. In such arrays of memory cells, a binary logic value of "1" or a binary logic value of "0," may be written to a memory cell via selection of a bit line coupled to a RAM cell of an array in response to a voltage applied to a gate region of a transistor utilized to access the RAM cell of the array.

However, when performing memory operations involving certain types of memory devices, such as memory devices comprising magnetic random-access memory (MRAM) cells, voltage and current signal levels utilized in writing operations may differ from the voltage and current signal levels utilized to perform memory operations involving other types of memory devices. For example, memory operations involving an array of MRAM cells may utilize substantially higher currents than memory operations involving, for example, CMOS-based static random-access memory cells. Thus, as a consequence of utilizing increased signal currents to perform memory operations, such as writing operations, opportunities for undesirable current leakage may also increase. Accordingly, developing circuitry and techniques for performing memory operations to MRAM cells while controlling current leakage paths continues to be an active area of investigation.

BRIEF DESCRIPTION OF THE DRAWINGS

The present technique(s) will be described further, by way of example, with reference to embodiments thereof as illustrated in the accompanying drawings. It should be understood, however, that the accompanying drawings illustrate only the various implementations described herein and are not meant to limit the scope of various techniques, methods, systems, or apparatuses described herein.

Figure 1:
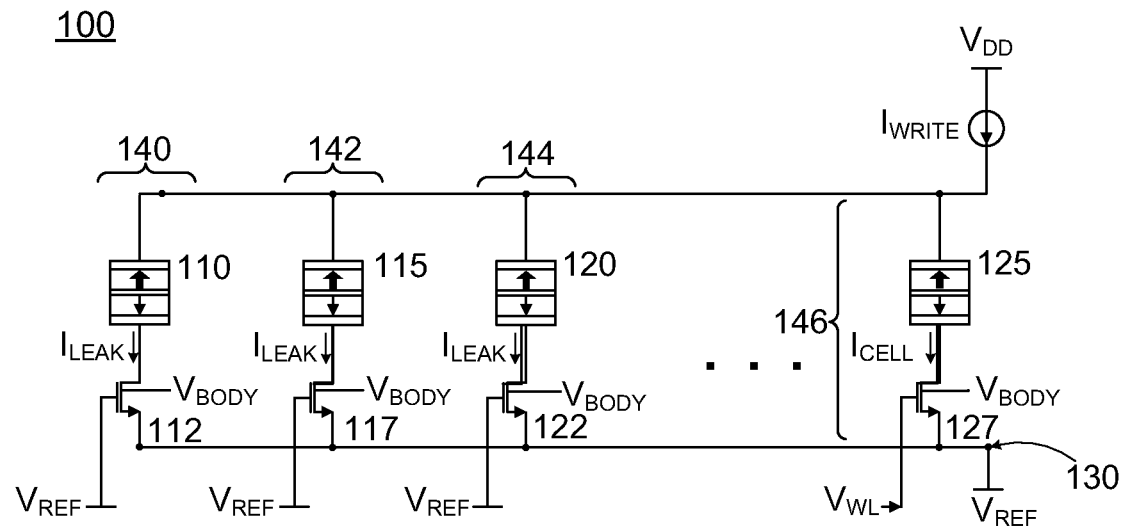
FIG. 1 is a circuit diagram showing current conduction through a first representative array of resistive memory cells during a memory writing operation according to various embodiments.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

As previously mentioned, in a computing device, which may include a general-purpose hand-held computer, a smart phone, etc., one or more arrays of memory cells may be utilized to store instructions, for example, for use by one or more processors of the computing device. In such memory cells, a binary logic value of "1" or a binary logic value of "0," may be written to a memory cell via selection of a bit line coupled to a RAM cell of the array in response to a voltage applied to a gate region of a transistor utilized to access the RAM cell. In particular types of memory cells, binary logic values may be encoded and stored utilizing, for example, a resistive state of the individual memory cell. For example, in one instance, a relatively high resistance of a resistive memory cell may indicate storage of a binary logic value of "1," while a relatively low resistance of the memory cell may correspond to a binary logic value of "0." It should be noted, however, that such correspondence between binary logic values and resistive states of memory cells is arbitrary, and claimed subject matter is not limited in this respect.

For certain memory technologies, such as MRAM cells involving magnetic tunneling junctions (MTJs), stored binary logic values may be indicated by way of a resistive state in response to an orientation of a magnetization vector of a first localized region of a MRAM cell relative to a second localized region of the MRAM cell. For example, storage of a first binary logic value, such as a "1," may correspond to a resistive state brought about by a magnetization vector of the first localized region being oriented substantially antiparallel to the magnetization vector of the second localized region. Storage of a second binary logic value, such as a "0," may be indicated by way of a resistive state brought about by a magnetization vector of the first localized region comprising an orientation substantially parallel to a magnetization vector of the second localized region. In MRAM systems utilizing MTJs, resistive states may be modified by coupling a signal, such as a signal comprising an electric current conducted through the first localized region, comprising a sufficient magnitude so as to reverse the magnetization vector of the first localized region with respect to the second localized region. Current conduction through a selected MRAM cell may be sensed via applying a signal to device coupled in series with the MRAM cell.

Thus, in this context, to "select" an individual resistive memory cell (e.g., a MRAM cell) is defined as permitting an appreciable current to be conducted through the individual resistive memory cell, wherein the quantity of conducted current permits a transition of the resistive state (e.g., a high-resistance state to a low-resistance state) of the memory cell. For example, selection of a resistive memory cell may be achieved via applying an appropriate signal, such as a voltage signal, to an input node of the individual resistive memory cell and applying another appropriate signal, such as a voltage signal, to a gate region of an access device coupled in series to an output node of the resistive memory cell. Thus, also in this context, a "selectable" individual resistive memory cell is defined as a memory cell comprising a memory state that can be transitioned via an access device coupled in series with the memory cell. As a corollary, to "unselect" an individual resistive memory cell is defined as the opposite of selection of an individual resistive memory cell. For example, an unselected individual resistive memory cell may correspond to a memory cell, coupled in series to an access device, for which a signal having a negligible amplitude (e.g., a reference voltage signal) is applied to a gate region of an access device, thus restricting current conduction through the memory cell and the access device.

However, for certain types of MRAM cells, such as MTJ cells, electric currents involved in the storage of binary logic values may comprise significantly higher values when compared to electric currents involved in the storage of binary logic values utilizing other types of memory cells. To enable access devices, such as transistor-based access devices, to conduct increased electrical currents, the access device may be body-biased, which may operate to reduce a threshold voltage of the access device. Reduction of the threshold voltage of an access device may occur substantially in accordance with expression (1), below:

$$V_{TH} = V_{T0} + \gamma(\sqrt{|2\Phi_f + V_{SB}|} - \sqrt{|2\Phi_f|}) \quad (1)$$

In expression (1), $V_{T0}$ refers to the threshold voltage of an access device comprising an NMOS transistor (e.g., without body-biasing), $\Phi_f$ refers to the Fermi potential (comprising a negative value for an NMOS transistor access device), and $\gamma$ corresponds to the body effect constant (comprising a negative value for an NMOS transistor access device). It may be appreciated that the quantity $V_{SB}$ of expression (1) may assume a negative value when body biasing comprises a higher potential with respect to the source node of a transistor access device. Accordingly, under such circumstances, the quantity $\sqrt{|2\Phi_f + V_{SB}|} - \sqrt{|2\Phi_f|}$ may comprise a negative value, which may thus bring about a reduction in $V_{TH}$ relative to $V_{T0}$.

Hence, as described in reference to expression (1), body-biasing of transistor access devices may permit increased current conduction through a series combination of an access device and a MRAM cell. Additionally, such increased current conduction may be controlled via application of an appropriate gate voltage applied to, for example, an individually selectable transistor access device of an array of transistor access devices. However, at least in particular instances, body-biasing of remaining, unselected transistor access devices, such as transistor access devices having gate regions that are coupled to a reference voltage (e.g., 0.0 V), may operate to increase leakage current through the unselected transistor access devices. Leakage current ($I_L$) exhibited by unselected transistor access devices may behave according to an exponential relationship computed substantially in accordance with expression (2) below:

$$I_L \alpha e^{(V_{GS} - V_{TH})} \quad (2)$$

From expression (2) it may be appreciated that for a given value of $V_{GS}$ (e.g., 0.0 V) as $V_{TH}$ decreases in magnitude, such as to a value that approaches 250.0 mV, 200.0 mV, or 150.0 mV, for example, $I_L$ may comprise an increasingly large value. Expression (2) may be indicative of a transistor access device operating in a subthreshold region.

However, despite a decrease in $V_{TH}$, which may, under particular circumstances, operate to increase leakage current of unselected transistor access devices operating in a subthreshold region, it may be apparent from expression (2) that leakage current ($I_L$) may be minimized via exerting control over gate voltage ($V_{GS}$). Thus, in one particular instance, when $V_{GS}$ of expression (2) comprises a negative value (e.g., $V_{GS}$<0.0), leakage current ($I_L$) may approach an increasingly negligible value. Accordingly, as described further herein, when body-biasing of transistor access devices operates to increase current conduction through individually selectable resistive memory devices, leakage current through unselected transistor access devices may be controlled via application of a positive voltage to the source region, relative to the gate region, of the unselected transistor access devices. In particular embodiments, when transistor access devices are body-biased utilizing relatively high voltages, such as a supply voltage (e.g., $V_{DD}$), and when gate regions of transistor access devices are coupled to negative voltages with respect to such body-biased voltages, leakage currents may be controlled so as to comprise very small amounts. Such body-biasing and coupling of gate regions of transistor access devices utilizing appropriate voltages may give rise to additional advantageous effects, and claimed subject matter is not limited in this respect.

Before discussing various embodiments in reference to the accompanying figures, a brief description of various nonlimiting embodiments is provided in the following paragraphs. For example, one particular embodiment may be directed to a circuit including a supply voltage at a first side of an array of elements, wherein each element of the array of elements includes a series combination of an access device and a memory cell, and wherein each access device may be coupled to a body-biasing voltage to bring about an increased current conducted through a corresponding element of the array. The circuit may additionally include a current source at a second side of the array of elements configured to generate the increased current conducted through each element of the array of elements and to control leakage current conducted through each element of the array. In the above-identified circuit, the body-biasing voltage may be substantially equal to the supply voltage. In addition, voltage of a source node of an unselected access device may be increased relative to a gate node so as to mimic effects of a negative $V_{GS}$.

In the above-identified circuit, an input node of the current source may be connected to a source node of each access device at the second side of the array of elements during a first writing operation to a memory cell of the array of elements. In addition, the memory cell of the array of elements may include a resistive memory cell. The resistive memory cell may include a magnetic random-access memory (MRAM) cell, wherein the first writing operation brings about a reorienting a magnetization vector of a first localized region of the MRAM cell from an antiparallel orientation to a parallel orientation with respect to a second localized region of the MRAM cell.

In one embodiment, an input node of the current source may be connected to each memory cell of the array of elements at the first side of the array of elements during a second writing operation to a memory cell of the array of elements. In another embodiment, the memory cell of the array of elements may include a resistive memory cell. In one embodiment, the resistive memory cell may include a magnetic random-access memory (MRAM) cell, wherein the second writing operation brings about a reorienting magnetization vectors of a first localized region of the MRAM cell from a parallel orientation to an antiparallel orientation with respect to a second localized regions of the MRAM cell.

In one embodiment, a circuit may include a supply voltage at a first side of an array that extends in a first dimension and a current source at a second side of the array, in which each element of the array includes an access device combined in series with a resistive memory cell, and in which the access device included in each element of the array may be coupled to a body-biasing voltage. The body-biasing voltage may be substantially equal to the supply voltage. Additionally, the current source at the second side of the array and a voltage applied to a gate region of the access device included in each element of the array may cooperate to bring about a gate-to-source voltage that may be less than the reference of the supply voltage. In the above-described circuit, an input node of the current source may be connected to a source node of the access device included in each element of the array at the second side of the array during a first writing operation to a resistive memory cell included in an element of the array. An input node of the current source may be connected to each resistive memory cell of the array at the first side of the array during a second writing operation to a resistive memory cell included in an element of the array. In the above-described circuit, an unselected access device included in an element of the array may permit conduction of a leakage current of no more than about 10.0 picoAmpere. The resistive memory cell included in each element of the array may include a magnetic random-access memory (MRAM) cell.

In one embodiment, a method may include forming an array of memory cells, wherein each memory cell of the array may be coupled in series with a corresponding access device. The method may additionally include forming a first circuit to operate as a current source at a first side of the array and forming a second circuit to operate as a first voltage source at a second side of the array. The method may further include forming a connection between a second voltage source and the corresponding access device of the array to body-bias the corresponding access device of the array. In an embodiment, the first voltage source provides a voltage that may be substantially equal to the voltage provided by the second voltage source. In an embodiment, each memory cell of the array may include a magnetic random-access memory (MRAM) cell, which may include a magnetic tunneling junction.

Particular embodiments will now be described with reference to the figures, such as FIG. 1, which is a circuit diagram 100 showing current conduction through a first representative array of resistive memory cells during a memory writing operation according to various embodiments. In diagram 100, elements 140, 142, 144, and 146 are shown as being organized into an array, which may correspond to a memory array utilized for storage of binary logic values. Thus, the array depicted in diagram 100 may bring about a capability to store a digital word, wherein each of elements 140, 142, 144, and 146 provides a capability to store a single binary logic value of the digital word. Accordingly, in one example, element 140 may provide a capability to store the most significant binary logic value or "bit" of the digital word, while element 146 may provide a capability to store the least significant binary logic value. Elements 142 and 144 of diagram 100 may be utilized to store other binary logic values of the digital word. It should be noted that although diagram 100 depicts only 4 elements, wherein each element may provide a capability to store a single binary logic value of a digital word, claimed subject matter is intended to embrace arrays comprising any number of elements, such as arrays comprising 8 elements, 16 elements, 64 elements, 128 elements, and so forth, virtually without limitation.

Elements 140, 142, 144, and 146 are depicted in diagram 100 as each comprising a resistive memory cell, such as resistive memory cells 110, 115, 120, and 125, respectively. In the embodiment of diagram 100, resistive memory cells 110, 115, 120, and 125 may comprise MRAM cells, such as cells comprising magnetic tunneling junctions (MTJs). Thus, as previously described herein, memory cells 110, 115, 120, and 125 may be capable of storing a first binary logic value, such as a "1," responsive to a magnetization vector of a first localized region of MRAM cell 110, for example, being oriented substantially antiparallel to the magnetization vector of a second localized region of MRAM cell 110. MRAM cell 110 may store a second binary logic value, such as a "0," responsive to the magnetization vector of the first localized region being oriented substantially parallel to the magnetization vector of the second localized region. It should be noted, however, that such correspondence between binary logic values and the parallel/antiparallel orientation of a magnetization vector of a first localized region with respect to a magnetization vector of a second localized region is arbitrary, and claimed subject matter is not limited in this respect.

In diagram 100, storage of binary values in MRAM cell 125, for example, may be controlled via access device 127 which may comprise, for example, a NMOS transistor. In particular embodiments, responsive to the application of an appropriate voltage, such as word line voltage $V_{WL}$, to a gate region of access device 127, an electric current may be conducted from current source $I_{WRITE}$, through MRAM cell 125, and in the direction of a reference voltage ($V_{REF}$). In certain embodiments, current source $I_{WRITE}$ may bring about current conduction of between about 1.0 µA and about 100.0 µA, although claimed subject matter is intended to embrace use of current sources to supply any quantity of electric current for conduction through a resistive memory cell and/or an access device.

Diagram 100 also depicts application of a body-bias voltage ($V_{BODY}$) to MRAM cells 110, 115, 120, and 125. In particular embodiments, application of body-bias voltage $V_{BODY}$ to MRAM cell 125, in combination with application of an appropriate word line voltage $V_{WL}$ to MRAM cell 125, may operate to permit current of a sufficient magnitude to conduct through MRAM cell 125. In the embodiment of diagram 100, such current ($I_{CELL}$) may be sufficient to transition MRAM cell 125 from a high-resistance state to a low-resistance state. In certain embodiments, a transition of MRAM cell 125 from a high-resistance state to a low-resistance state may be achieved via transitioning the magnetization vector of the first localized region of the MRAM cell from comprising an antiparallel orientation with respect to the second localized region of the MRAM cell to comprising parallel orientation with respect to the second localized region of the MRAM cell.

In contrast to selection of access device 127 via word line voltage $V_{WL}$, access devices 112, 117, and 122, are identified, as being an unselected by way of application of a reference voltage ($V_{REF}$) to the gate regions of the access devices. Accordingly, substantially in accordance with expression (2), access devices 112, 117, and 122 may operate in a subthreshold region wherein an exponential relationship exists between leakage current $I_{LEAK}$ and the threshold voltage of the access devices. Further, substantially in accordance with expression (1), threshold voltage of access devices 112, 117, and 122, which may be reduced via application of a body-biasing voltage $V_{BODY}$ with respect to source node 130 shown in diagram 100, gives rise to $V_{SB}$ of expression (1) comprising a negative value. Accordingly, as described further with respect to FIG. 2A (hereinbelow) leakage current $I_{LEAK}$ may comprise an increased value.

Figure 2A:
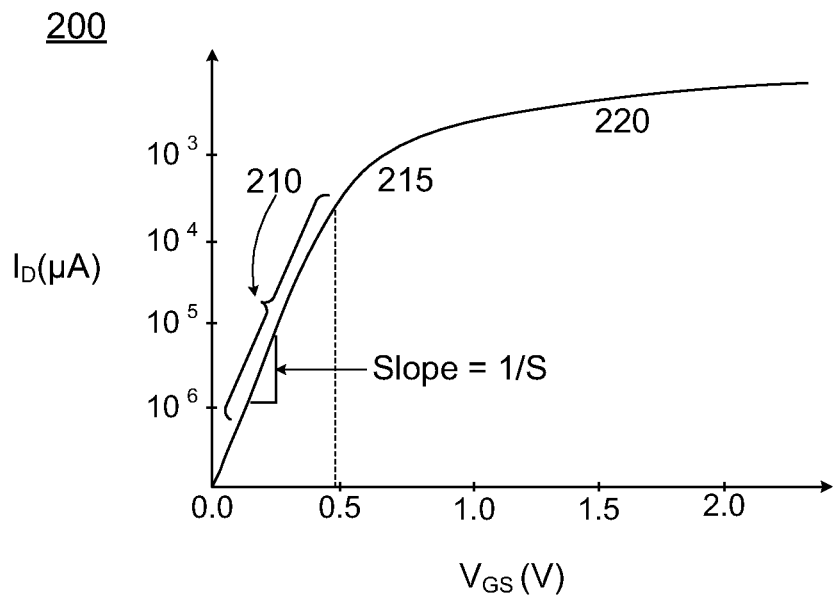
FIG. 2A-2B show graphs of current conduction through a representative transistor device, such as a transistor access device of FIG. 1, according to various embodiments.

FIG. 2A shows a graph 200 of current conduction through a representative transistor device, such as a transistor access device of FIG. 1, according to various embodiments. In graph 200, current conduction through the representative transistor access device may be divided into three operating regions, such as subthreshold region 210, quadratic region 215, and linear region 220. In an absence of a significant body-biasing voltage (e.g., $V_{BODY}$=0.0) for values of $V_{GS}$ less than 0.5 V, it may be appreciated that leakage current may decrease exponentially as $V_{GS}$ approaches 0.0 V. Substantially in accordance with expression (3), which may correspond to the reciprocal of the slope (1/S) of the logarithm of $I_D$ as a function of $V_{GS}$ as shown in graph 200, S may be expressed as:

$$S = n\left(\frac{kT}{q}\right)\ln(10) \quad (3)$$

Wherein k corresponds to Boltzmann's constant, T corresponds to an ambient temperature, and q corresponds to an electron charge (in coulombs). At an ambient temperature of about 300.0° C., S may comprise a value of approximately 60.0 mV/dec. Thus, it may be appreciated that in transistor access devices, such as access devices 112, 117, and 122 of FIG. 1A, relatively minor changes (e.g., 60.0 mV) may bring about significant increases in current conduction through the access device. For the example of graph 200, when $V_{GS}$ comprises a value of approximately 0.0 V, which may correspond to $V_{REF}$ shown in diagram 100, $I_D$ comprises a value of approximately $10^{-7}$ µA.

Figure 2B:
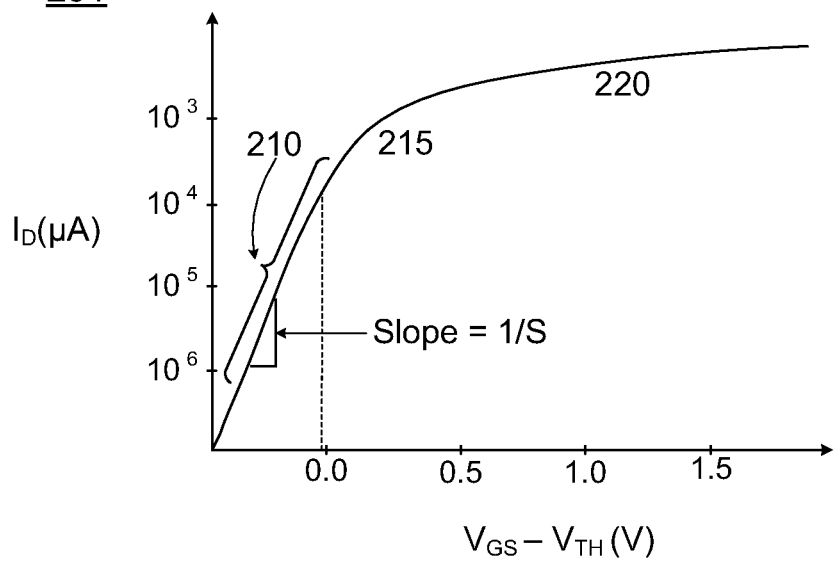

FIG. 2B shows a graph (201) of current conduction through a representative transistor device, such as a transistor access device of FIG. 1, according to various embodiments. Graph 201 differs from a graph 200 (of FIG. 2A) in that the horizontal axis of FIG. 2B has been modified to describe $I_D$ as a function of $V_{GS}$-$V_{TH}$. Thus, as described in relation to expression (2), when $V_{TH}$ decreases, such as in response to body-biasing as described with reference to expression (1) herein, significant leakage current may result. In the example of graph 201, when $V_{GS}$-$V_{TH}$ comprises a value of approximately 0.0 V, $I_D$ comprises a value of between approximately $10^{-4}$ µA. Such an increase in $I_D$ of from graph 200 (FIG. 2A) to graph 201 (FIG. 2B) indicates an increase in subthreshold current of approximately $10^3$ µA. In at least particular implementations, such increases in subthreshold current may be undesirable.

Figure 3:
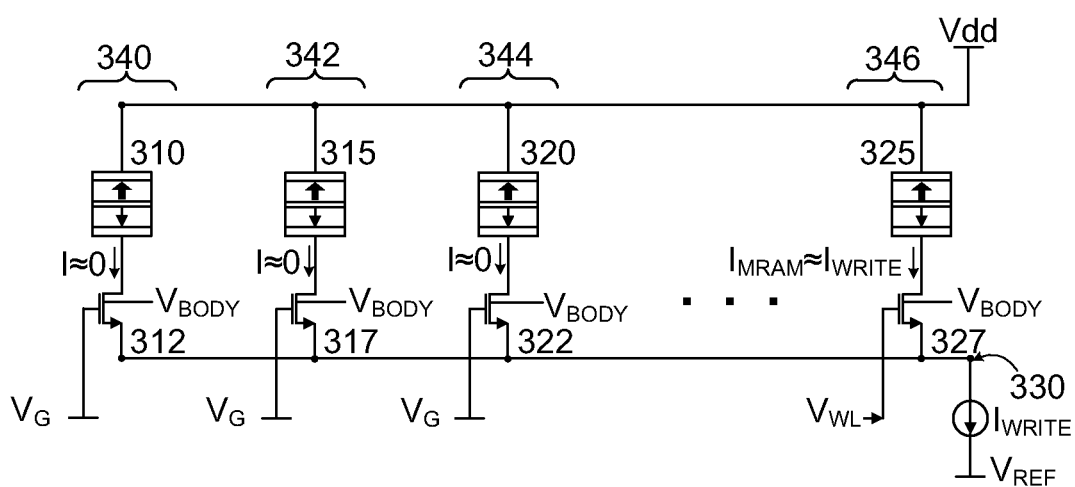
FIG. 3 is a circuit diagram showing current conduction through a second representative array of resistive memory cells during a memory writing operation according to an embodiment.

FIG. 3 is a circuit diagram 300 showing current conduction through a second representative array of resistive memory cells during a memory writing operation according to an embodiment. In diagram 300, elements 340, 342, 344, and 346 are shown as being organized into an array, which may correspond to a memory array utilized for storage of binary logic values. In a manner similar to elements 140, 142, 144, and 146 of diagram 100, elements 340, 342, 344, and 346 may provide a capability to store binary logic values of a digital word in which, for example, the most significant bit of a digital word may be stored via element 340 and the least significant bit of the digital word may be stored via element 344. In addition, similar to FIG. 1, although only 4 elements are depicted in FIG. 3, claimed subject matter is intended to embrace memory arrays comprising any number of elements, such as arrays comprising 8 elements, 16 elements, 64 elements, and so forth, virtually without limitation.

Elements 340, 342, 344, and 346 are depicted in diagram 300 as each comprising a resistive memory cell, which may comprise a MRAM (e.g., a MTJ). Thus, elements 340, 342, 344, and 346 may be capable of storing first and second binary logic values responsive to parallel/antiparallel orientation of a magnetization vector of a first localized region of a memory cell with respect to a second localized region of the memory cell. In a particular implementation, the circuit of diagram 300 may be particularly suited for transitioning a first localized region of resistive memory cells 310, 315, 320, and 325 (e.g., each comprising a MTJ) from an antiparallel orientation to a parallel orientation with respect to the magnetization vector of a second localized region of a MTJ.

However, in contrast to the circuit of diagram 100, the circuit of diagram 300 depicts source nodes of access devices 312, 317, 322, and 327, which may comprise transistor access devices, being coupled to an input port of current source $I_{WRITE}$. Accordingly, a voltage present at source nodes of access devices 312, 317, 322, and 327 may comprise a value substantially dissimilar from $V_{REF}$, such as a value greater than $V_{REF}$, as depicted in diagram 100. In diagram 300, responsive to $V_{WL}$ being selected to comprise an appropriate signal value, such as a voltage signal having a value greater than a voltage present at a source node, a binary logic value may be written to cell 325. In diagram 300, when access device 327 is selected to comprise a value of $V_{WL}$, access devices 312, 317, and 322 may remain unselected via application of a reference voltage ($V_G$) to gate regions of the access devices.

However, as previously described herein, when source nodes of unselected access devices 312, 317, and 322, comprise a value dissimilar to $V_{REF}$ (such as greater than $V_{REF}$) leakage current conduction through the unselected devices may be reduced or at least kept within the limits. Such limiting of leakage current may be exhibited substantially in accordance with expression (2), which is repeated below:

$$I_L \alpha e^{(V_{GS}-V_{TH})} \quad (2)$$

From expression (2) it may be appreciated that when source nodes of unselected access devices, such as devices 312, 317, and 322, comprise a value greater than $V_{REF}$, and when $V_G$ comprises a value of $V_{REF}$, $V_{GS}$ of expression (2) comprises a negative value. In such instances, expression (2) may be rewritten as expression (4), below:

$$I_L \alpha e^{(V_{REF}-V_S-V_{TH})} \quad (4)$$

For instances in which $V_{REF}$ comprises a signal ground (e.g., $V_{REF}=0.0$), expression (4) may be rendered substantially in accordance with expression (5), below:

$$I_L \alpha e^{(-V_S-V_{TH})} \quad (5)$$

Thus, it may be appreciated that in accordance with expression (5), when source nodes of access devices, such as access devices 312, 317, and 322 comprise a voltage greater than a voltage applied to a gate region of the access devices, leakage current, which may be exponentially related to $(-V_S-V_{TH})$, as indicated in expression (5), may be controlled. Accordingly, despite effects of body-biasing of access devices 312, 317, and 322, which may operate to increase leakage current, such increases in leakage current may be offset, or canceled entirely, by way of increasing voltages applied to source nodes of access transistors with respect to $V_G$. In one example, as further described in relation to Table I, below, when a voltage is applied to the source node of an access device, such as access device 312, 317, or 322, leakage current may be significantly reduced.

TABLE I

| $I_{WRITE}$ | For Node 330 = 0.0 | | For Node 330 ≠ 0.0 | |
|---|---|---|---|---|
| (μA) | $I_{LEAK}$ (μA) | $I_{MTJ}$ (μA) | $I_{LEAK}$ (μA) | $I_{MTJ}$ (μA) |
| 80.0 | ~60.0 | ~20.0 | ~0.02 | ~79.98 |

Thus, as shown in Table I, in one embodiment, responsive to a source node of an access device comprising a value dissimilar from (e.g., greater than) a reference voltage, leakage current may be significantly reduced. Such reduction in leakage current may be expected in view of the previously described exponential relationship between $-V_S-V_{TH}$ and leakage current as discussed with reference to expression (5). Accordingly, as shown in diagram 300, leakage currents identified as conducting through unselected memory cells 310, 315, and 320 may approximate 10.0 picoAmpere (I≈0.0 in diagram 300).

Figure 4:
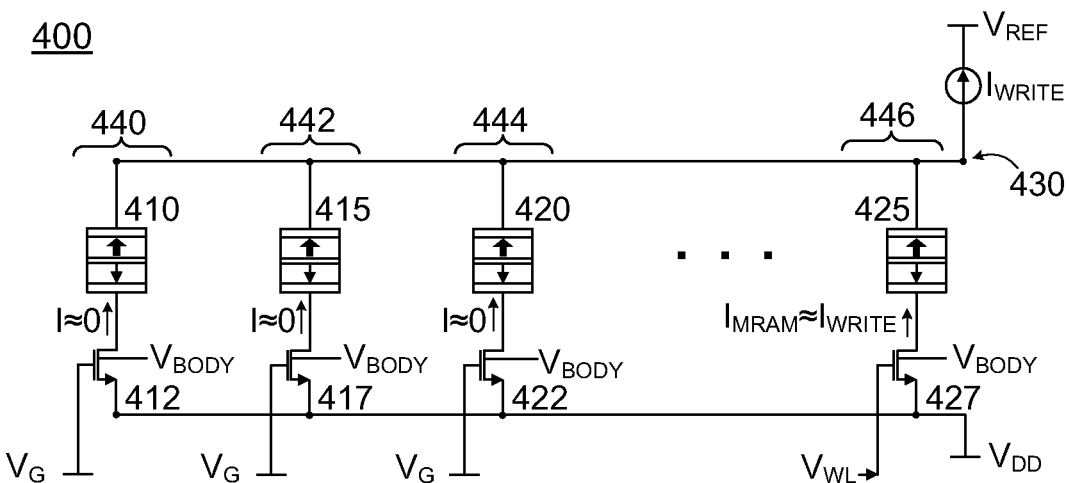
FIG. 4 is a circuit diagram showing current conduction through a third representative array of resistive memory cells during a memory writing operation according to another embodiment.

FIG. 4 is a circuit diagram 400 showing current conduction through a third representative array of resistive memory cells during a memory writing operation according to another embodiment. In a manner similar to diagram 300, elements 440, 442, 444, and 446 are shown as organized into an array, which may correspond to a memory array utilized for storage of binary logic values. Thus, elements 440, 442, 444, and 446 may provide a capability to store binary logic values of a digital word in which the most significant bit of the digital word may be stored via element 440 and the least significant bit may be stored via element 444. In addition, similar to diagram 300, although only 4 elements are depicted, claimed subject matter is intended to embrace memory arrays comprising any number of elements, such as arrays comprising 8 elements, 16 elements, 64 elements, and so forth, virtually without limitation. Elements 440, 442, 444, and 446 are depicted in diagram 400 as each comprising a resistive memory cell, which may comprise MRAM (e.g., a MTJ). Thus, elements 440, 442, 444, and 446 may be capable of storing first and second binary logic values responsive to parallel/antiparallel orientation of a magnetization vector of a first localized region of a memory cell with respect to a second localized region of the memory cell. In a particular implementation, the circuit of diagram 400 may be particularly suited for transitioning resistive memory cells 410, 415, 420, and 425 (e.g., each comprising a MTJ) from a parallel orientation to an antiparallel orientation of the magnetization vector of a first localized region of a MTJ with respect to the magnetization vector of a second localized region of the MTJ.

However, in contrast to diagram 300, diagram 400 depicts source nodes of access devices 412, 417, 422, and 427, at least some of which corresponding to transistor access devices, as being coupled to a supply voltage signal $V_{DD}$. Responsive to $V_{WL}$ comprising an appropriate signal value, such as a voltage signal having a value sufficient to induce current conduction of $I_{MRAM}$ through MRAM cell 425, a binary logic value may be written to cell 425. In diagram 400, when access device 427 is selected to comprise a value of $V_{WL}$, access devices 412, 417, and 422 may remain unselected by way of application of a reference voltage to gate region ($V_G$).

However, as previously described herein, when source nodes of unselected access devices 412, 417, and 422 comprise a relatively high value, such as $V_{DD}$, current conduction through the access devices may be reduced. Such reduction may be exhibited substantially in accordance with expression (2), which is repeated below:

$$I_L \alpha e^{(V_{GS}-V_{TH})} \quad (2)$$

From expression (2) it may be appreciated that when source nodes of unselected access devices, such as devices 412, 417, and 422, comprise a value of $V_{DD}$, and when $V_G$ comprises a value of $V_{REF}$, $V_{GS}$ of expression (2) comprises a negative value. In such instances, expression (2) may be rewritten as expression (6), below:

$$I_L \alpha e^{(V_{REF}-V_S-V_{TH})} \quad (6)$$

wherein $V_{REF}-V_S$ has been substituted for $V_{GS}$. For instances in which $V_{REF}$ comprises a signal ground (e.g., $V_{REF}=0.0$) expression (4) may be rendered substantially in accordance with expression (7), below:

$$I_L \alpha e^{(-V_S-V_{TH})} \quad (7)$$

Thus, it may be appreciated that in accordance with expression (7), when source nodes of access devices, such as access devices 412, 417, and 422 comprise a voltage greater than a voltage applied to a gate region of the access devices, leakage current, which may be exponentially related to $-V_S-V_{TH}$, as indicated in expression (7) may be reduced. Accordingly, despite effects of body-biasing of access devices 412, 417, and 422, which may operate to increase leakage current, such increases in leakage current may be offset, or canceled entirely, by way of applying a voltage signal, such as $V_{DD}$ to source node voltages of transistor access devices. In one example, as further described in relation to Table II, below, when the source node of an access device comprises a value of $V_{DD}$, such as access device 412, 417, or 422, leakage current may be significantly reduced.

TABLE II

| $I_{WRITE}$ | For Source Nodes = $V_{REF}$ | | For Source Nodes = $V_{DD}$ | |
|---|---|---|---|---|
| (μA) | $I_{LEAK}$ (μA) | $I_{MTJ}$ (μA) | $I_{LEAK}$ (μA) | $I_{MTJ}$ (μA) |
| 80.0 | ~77.0 | ~3.0 | ~6.5 | ~73.5 |

As shown in Table II, in one embodiment, responsive to a signal at node 430, which may correspond to an input node of a memory cell, comprising a value dissimilar from (e.g., greater than) a reference voltage, leakage currents may be significantly reduced. Such reduction in leakage current may be expected in view of the previously described exponential relationship between $-V_{DD}-V_{TH}$ and leakage current as discussed with reference to expression (7).

Figure 5:
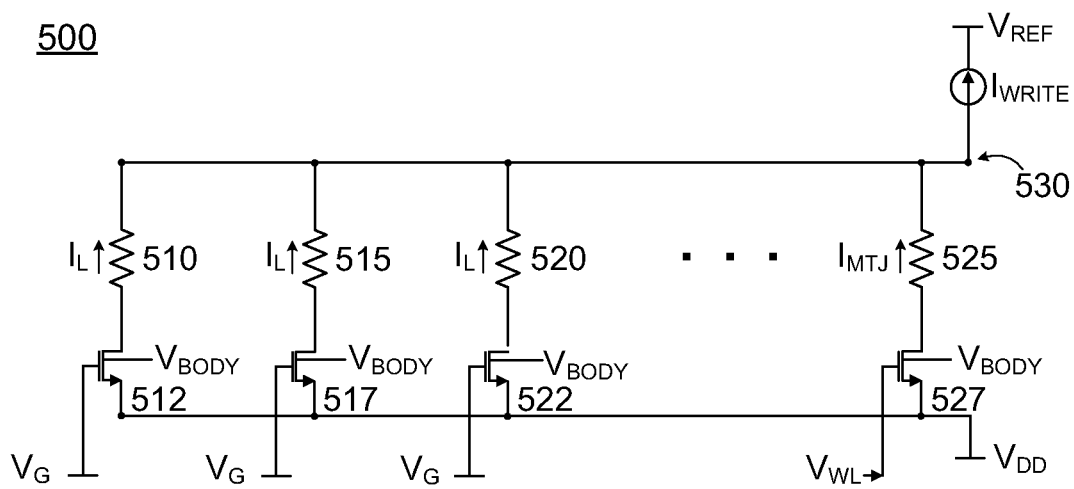
FIG. 5 is a circuit diagram showing current conduction, responsive to variations in memory write current, through resistors that represent resistive memory cells according to an embodiment.

FIG. 5 is a circuit diagram showing current conduction, responsive to variations in memory write current, through resistors that represent resistive memory cells according to an embodiment. In circuit diagram 500, resistors 510, 515, 520 represent unselected resistive memory cells through which a leakage current $I_L$ may conduct in response to activation of current source $I_{WRITE}$, while voltage signal $V_{DD}$ is applied to source nodes of access devices 512, 517, 522, and 527. It may be appreciated that when gate regions of access devices 512, 517, and 522 are coupled to a reference voltage $V_G$ (e.g., voltage ground), the access devices may operate in a subthreshold region, such as region 210 shown in graph 200 (FIG. 2B herein). Accordingly, leakage current $I_L$ may exhibit an exponential relationship as a function of, for example, threshold voltage as well as body-biasing voltage $V_{BODY}$ of access devices 512, 517, and 522. Circuit diagram 500 additionally depicts resistor 525, which represents a resistive memory cell that has been selected via application of a signal voltage $V_{WL}$ applied to a gate region of access device 527. Thus, under such conditions, it may be appreciated that current $I_{MTJ}$, which represents current conducted through resistor 525, comprises a much greater value than $I_L$. It may also be appreciated that access device 527 may operate in linear region 220 shown in graph 200 (FIG. 2B herein).

It may additionally be appreciated that variations in temperature, process, dopant concentrations of transistor devices utilized in the construction of the circuit of diagram 500 may exhibit variations in the current provided by current source $I_{WRITE}$. Thus, for example, when $I_{WRITE}$ increases from a nominal value, a voltage drop across, for example, resistor 525 may also increase. Responsive to an increased current conduction through resistor 525, a voltage present at node 530 may decrease. Accordingly, as a consequence of a decrease in voltage at node 530, a voltage drop across unselected resistors 510, 515, and 520 may increase. Under such conditions, in view of the operation of access devices 512, 517, and 522 in the subthreshold region, an increase in voltage drop across access devices 512, 517, and 522 may give rise to a significant increase in leakage current $I_L$. However, responsive to operation of access device 527 in linear region 220 as shown in graph 200 (FIG. 2 herein), current $I_{MTJ}$ may increase at a significantly reduced rate in comparison with leakage current $I_L$. Thus, in at least particular embodiments, variations in current provided by current sources, such as $I_{WRITE}$ may operate to increase leakage current through unselected access devices, such as access devices 512, 517, and 522, without significantly increasing current conducted through a selected resistive memory cells, such as represented by resistor 525. In certain embodiments, such control may be beneficial in controlling heat dissipated by selected resistive memory cells and corresponding access devices, as well as providing other benefits, and claimed subject matter is not limited in this respect.

Figure 6:
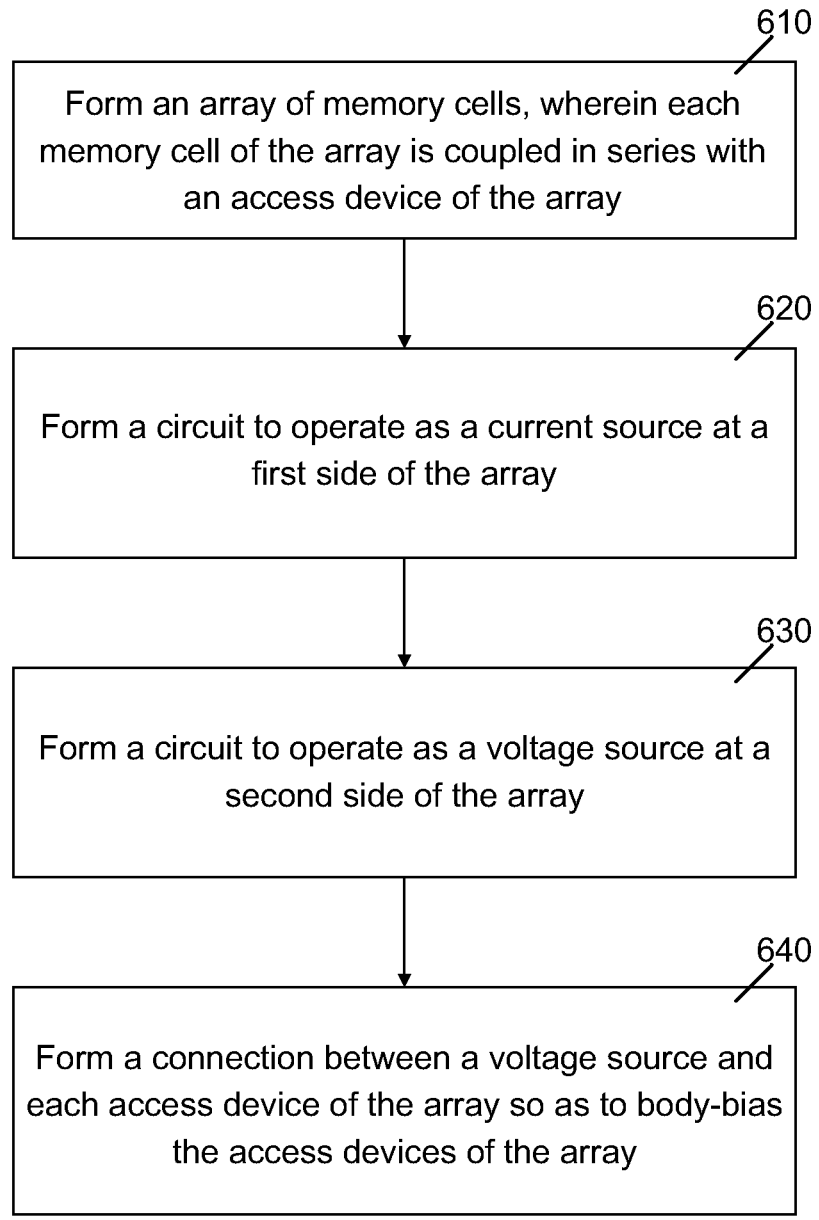
FIG. 6 is a flow chart for a method of fabricating a circuit according to an embodiment.

FIG. 6 is a flow chart 600 for a method of fabricating a circuit according to an embodiment. FIG. 6 may include blocks in addition to those shown and described, fewer blocks or blocks occurring in an order different than may be identified, or any combination thereof. The method of FIG. 6 begins at block 610, which may comprise forming an array of memory cells, wherein each memory cell of the array is coupled in series with an access device of the array. The array of memory cells formed at block 610 may comprise resistive memory cells, such as MRAM cells (e.g., MTJ cells), for example. Further, the array of memory cells formed at block 610 may comprise virtually any number of memory cells, such as 8 memory cells, 16 memory cells, 32 memory cells, 64 memory cells, and so forth, virtually without limitation. In particular embodiments, access devices formed at block 610 may correspond to transistor access devices.

The method may continue at block 620, which may include forming a circuit to operate as a current source at a first side of the array. In particular embodiments, such as those in accordance with FIG. 3 a current source may comprise an input coupled to a source node of an access transistor. In other embodiments, such as those in accordance with FIG. 4, a current source may include an input node coupled to an output node of an array of resistive memory cells. The method may continue at block 630, which may include forming a circuit to operate as a voltage source at a second side of the array. In particular embodiments, such as those in accordance with FIG. 3, the voltage source may be coupled to an input node to an array resistive memory cells, wherein each resistive memory cell is coupled in series with an access device, such as an access transistor. In other embodiments, such as those in accordance with FIG. 4, the voltage source may be coupled to source nodes of access devices coupled in series with resistive memory cells.

The method may continue at block 640, which may comprise forming a connection between a voltage source and each access device of the array so as to body-bias the access devices of the array. In one embodiment, body-biasing of access devices may include applying a body bias of $V_{DD}$, such as shown and described in reference to FIGS. 3 and 4. In certain other embodiments, body-biasing of access device may include applying a body-biasing voltage of a level other than $V_{DD}$, and claimed subject matter is not limited in this respect.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope of the invention as defined by the appended claims. For example, various combinations of the features of the dependent claims could be made with the features of the independent claims without departing from the scope of the present invention.

What is claimed is:

1. A circuit, comprising:
 a supply voltage at a first side of an array of elements, wherein each element of the array of elements includes a series combination of an access device and a memory cell, and wherein a body terminal of each access device is coupled to a body-biasing voltage to bring about an increased current conducted through a corresponding element of the array; and
 a current source at a second side of the array of elements configured to generate the increased current conducted through each element of the array of elements and to control leakage current conducted through each element of the array.

2. The circuit of claim 1, wherein the body-biasing voltage is substantially equal to the supply voltage.

3. The circuit of claim 1, wherein a gate node of an unselected access device of a corresponding element of the array of elements is coupled to a voltage that brings about a gate-to-source voltage of the unselected access device that is less than the reference of the supply voltage.

4. The circuit of claim 1, wherein an input node of the current source is connected to a source node of each access device at the second side of the array of elements during a writing operation to a memory cell of the array of elements.

5. The circuit of claim 4, wherein the memory cell of the array of elements comprises a resistive memory cell.

6. The circuit of claim 5, wherein the resistive memory cell comprises a magnetic random-access memory (MRAM) cell, and wherein the writing operation brings about a reorienting a magnetization vector of a first localized region of the MRAM cell from an antiparallel orientation to a parallel orientation with respect to a second localized region of the MRAM cell.

7. The circuit of claim 1, wherein an input node of the current source is connected to each memory cell of the array of elements at the first side of the array of elements during a writing operation to a memory cell of the array of elements.

8. The circuit of claim 7, wherein the memory cell of the array of elements comprises a resistive memory cell.

9. The circuit of claim 8, wherein the resistive memory cell comprises a magnetic random-access memory (MRAM) cell, and wherein the writing operation brings about a reorienting magnetization vectors of a first localized region of the MRAM cell from a parallel orientation to an antiparallel orientation with respect to a second localized regions of the MRAM cell.

10. A circuit, comprising:
a supply voltage at a first side of an array that extends in a first dimension; and
a current source at a second side of the array, wherein each element of the array includes an access device combined in series with a resistive memory cell, and wherein
a body terminal of the access device included in each element of the array is coupled to a body-biasing voltage.

11. The circuit of claim 10, wherein the body-biasing voltage is substantially equal to the supply voltage.

12. The circuit of claim 10, wherein the current source at the second side of the array and a voltage applied to a gate region of the access device included in each element of the array cooperate to bring about a gate-to-source voltage that is less than the reference of the supply voltage.

13. The circuit of claim 10, wherein an input node of the current source is connected to a source node of the access device included in each element of the array at the second side of the array during a writing operation to a resistive memory cell included in an element of the array.

14. The circuit of claim 10, wherein an input node of the current source is connected to each resistive memory cell of the array at the first side of the array during a writing operation to a resistive memory cell included in an element of the array.

15. The circuit of claim 10, wherein an unselected access device included in an element of the array permits conduction of a leakage current of no more than about 10.0 picoAmpere.

16. The circuit of claim 10, wherein the resistive memory cell included in each element of the array comprises a magnetic random-access memory (MRAM) cell.

* * * * *